(12) United States Patent
Yeom et al.

(10) Patent No.: US 12,543,337 B2
(45) Date of Patent: Feb. 3, 2026

(54) OXIDE FILM COATING SOLUTION AND SEMICONDUCTOR DEVICE MANUFACTURING METHOD USING THE SAME

(71) Applicant: SAMSUNG ELECTRONICS CO., LTD., Suwon-si (KR)

(72) Inventors: Chang Ju Yeom, Seoul (KR); Chang Su Jeon, Hwaseong-si (KR); Jung Min Oh, Incheon (KR); Sang Won Bae, Suwon-si (KR); Jae Sung Lee, Suwon-si (KR); Hyo San Lee, Hwaseong-si (KR); Jung Hun Lim, Daejeon (KR)

(73) Assignees: SAMSUNG ELECTRONICS CO., LTD., Suwon-si (KR); Soulbrain Co., Ltd., Seongnam-Si (KR)

( * ) Notice: Subject to any disclaimer, the term of this patent is extended or adjusted under 35 U.S.C. 154(b) by 784 days.

(21) Appl. No.: 17/693,532

(22) Filed: Mar. 14, 2022

(65) Prior Publication Data
US 2022/0320317 A1   Oct. 6, 2022

(30) Foreign Application Priority Data
Mar. 31, 2021   (KR) .................. 10-2021-0041989

(51) Int. Cl.
*H10D 30/43*   (2025.01)
*B82Y 10/00*   (2011.01)
(Continued)

(52) U.S. Cl.
CPC ....... *H10D 30/031* (2025.01); *H01L 21/0217* (2013.01); *H10D 64/033* (2025.01);
(Continued)

(58) Field of Classification Search
CPC .............. H10D 30/031; H10D 64/033; H10D 30/6735; H10D 62/118; H10D 64/689;
(Continued)

(56) References Cited

U.S. PATENT DOCUMENTS 5,622,896 A    4/1997  Knotter et al.
2014/0225065 A1  8/2014  Rachmady et al.
(Continued)

FOREIGN PATENT DOCUMENTS

KR    10-0839360 B1    6/2008
KR    10-0888613 B1    3/2009
(Continued)

*Primary Examiner* — Dale E Page
*Assistant Examiner* — Daniel J Hibbert
(74) *Attorney, Agent, or Firm* — Muir Patent Law, PLLC

(57) ABSTRACT

A method for manufacturing a semiconductor device, the method including forming a fin type pattern including a lower pattern and an upper pattern on a substrate, the upper pattern including a plurality of sacrificial layers and a plurality of sheet patterns alternately stacked on the lower pattern; forming a field insulating film on the substrate and the fin type pattern such that the field insulation film covers side walls of the lower pattern; forming a passivation film on the field insulating film such that the passivation film extends along an upper surface of the field insulating film; and removing the plurality of sacrificial layers after forming the passivation film.

18 Claims, 17 Drawing Sheets

(51) Int. Cl.
*H01L 21/02* (2006.01)
*H10D 30/01* (2025.01)
*H10D 64/01* (2025.01)
*H01L 23/29* (2006.01)
*H01L 23/31* (2006.01)
*H10D 30/67* (2025.01)
*H10D 62/10* (2025.01)
*H10D 64/68* (2025.01)

(52) U.S. Cl.
CPC ........ *H01L 23/291* (2013.01); *H01L 23/3171* (2013.01); *H10D 30/6735* (2025.01); *H10D 62/118* (2025.01); *H10D 64/689* (2025.01)

(58) Field of Classification Search
CPC .. H10D 30/014; H10D 30/43; H10D 30/6757; H10D 62/121; H01L 21/0217; H01L 23/291; H01L 23/3171; H01L 21/76224; H01L 21/02211; H01L 21/02282; H01L 21/02164; B82Y 10/00
See application file for complete search history.

(56) References Cited

U.S. PATENT DOCUMENTS

| | | | |
|---|---|---|---|
| 2017/0345945 A1* | 11/2017 | Lee | H10D 62/116 |
| 2019/0390111 A1 | 12/2019 | Kim et al. | |
| 2020/0381555 A1* | 12/2020 | Lee | H10D 30/6757 |

FOREIGN PATENT DOCUMENTS

| KR | 10-2010-0081315 A | 7/2010 |
|---|---|---|
| KR | 10-2019-0038459 A | 4/2019 |
| KR | 10-2019-0108828 A | 9/2019 |
| KR | 1020200029264 A | 3/2020 |

* cited by examiner

OXIDE FILM COATING SOLUTION AND SEMICONDUCTOR DEVICE MANUFACTURING METHOD USING THE SAME

CROSS-REFERENCE TO RELATED APPLICATION

This application claims priority from Korean Patent Application No. 10-2021-0041989 filed on Mar. 31, 2021 in the Korean Intellectual Property Office, and all the benefits accruing therefrom under 35 U.S.C. 119, the contents of which in its entirety are herein incorporated by reference.

BACKGROUND

1. Field

Embodiments relate to an oxide film coating solution and a method for manufacturing a semiconductor device using the same.

2. Description of the Related Art

As one of scaling technologies for increasing density of semiconductor devices, a multi gate transistor in which a multi-channel active pattern (or a silicon body) having a fin or nanowire shape is formed on a substrate and a gate is formed on a surface of the multi-channel active pattern has been considered.

SUMMARY

The embodiments may be realized by providing a method for manufacturing a semiconductor device, the method including forming a fin type pattern including a lower pattern and an upper pattern on a substrate, the upper pattern including a plurality of sacrificial layers and a plurality of sheet patterns alternately stacked on the lower pattern; forming a field insulating film on the substrate and the fin type pattern such that the field insulation film covers side walls of the lower pattern; forming a passivation film on the field insulating film such that the passivation film extends along an upper surface of the field insulating film; and removing the plurality of sacrificial layers after forming the passivation film.

The embodiments may be realized by providing a method for manufacturing a semiconductor device, the method including forming a first fin type pattern including a first lower pattern and a first upper pattern on a first region of a substrate such that the first upper pattern includes a plurality of first sacrificial layers and a plurality of first sheet patterns alternately stacked on the first lower pattern; forming a second fin type pattern including a second lower pattern and a second upper pattern on a second region of the substrate such that the second upper pattern includes a plurality of second sacrificial layers and a plurality of second sheet patterns alternately stacked on the second lower pattern; forming a first field insulating film on the first region of the substrate such that the first field insulating film covers side walls of the first lower pattern; forming a second field insulating film on the second region of the substrate such that the second field insulating film covers side walls of the second lower pattern; forming an insulating liner on the second field insulating film, along profiles of an upper surface of the second field insulating film, and on the second upper pattern; forming a first passivation film and a second passivation film on the first field insulating film and the insulating liner; and removing the plurality of first sacrificial layers, after forming the first passivation film and the second passivation film.

The embodiments may be realized by providing an oxide film coating solution including a silane compound; and an organic solvent in which the silane compound is dissolved, wherein the silane compound is represented by Chemical Formula 1 or Chemical Formula 2 below:

$(R)_n$—Si—$(R')_m$  (Chemical Formula 1)

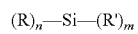

in Chemical Formula 1, R is an alkyl having a carbon number of 1 to 20, amine, fluorine, chlorine, vinyl, sulfur, methacryl, acetoxy, isocyanurate, or alkyleneoxy group, R' is an alkyl, methoxy, ethoxy, chloro, or disilazane group, n and m are integers of 1 to 3, and n+m is 4, $(R_3$—Si$)_n$—N—$(H)_m$  (Chemical Formula 2)

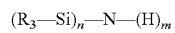

in Chemical Formula 2, R is an alkyl having a carbon number of 1 to 20, amine, fluorine, chlorine, vinyl, sulfur, methacryl, acetoxy, isocyanurate, or alkyleneoxy group, n and m are integers of 0 to 3, and n+m is 3.

BRIEF DESCRIPTION OF THE DRAWINGS

Features will be apparent to those of skill in the art by describing in detail exemplary embodiments with reference to the attached drawings in which.

DETAILED DESCRIPTION

A semiconductor device according to some embodiments may, e.g., include a tunneling transistor (tunneling FET), a three-dimensional (3D) transistor, a transistor based on two-dimensional materials (2D material based FETs), or a heterostructure thereof. Further, the semiconductor device according to some embodiments may also include a bipolar junction transistor, a laterally diffused metal oxide semiconductor (LDMOS), or the like. As used herein, the term "or" is not an exclusive term, e.g., "A or B" would include A, B, or A and B.

The oxide film coating solution according to some embodiments will be described referring to FIGS. 1 and 2.

Figure 1:
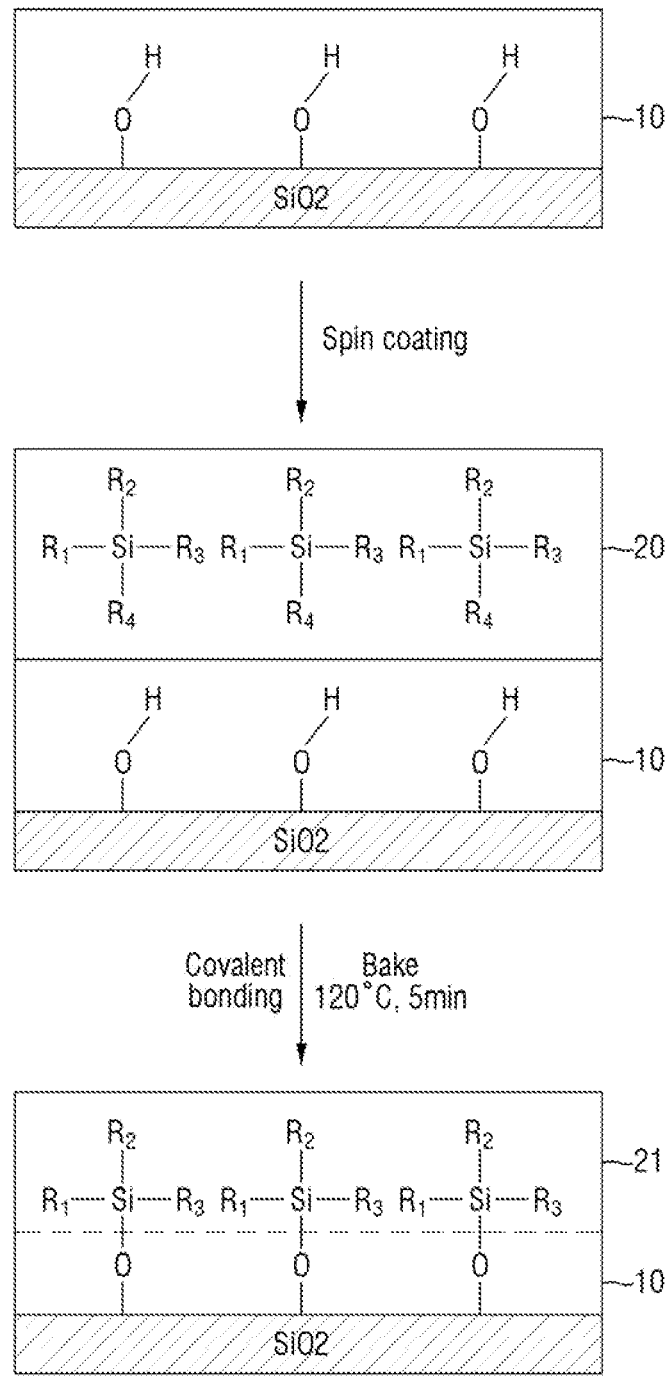
FIGS. 1 and 2 are intermediate stage diagrams of a coating process of the oxide film coating solution according to some embodiments.
Figure 2:
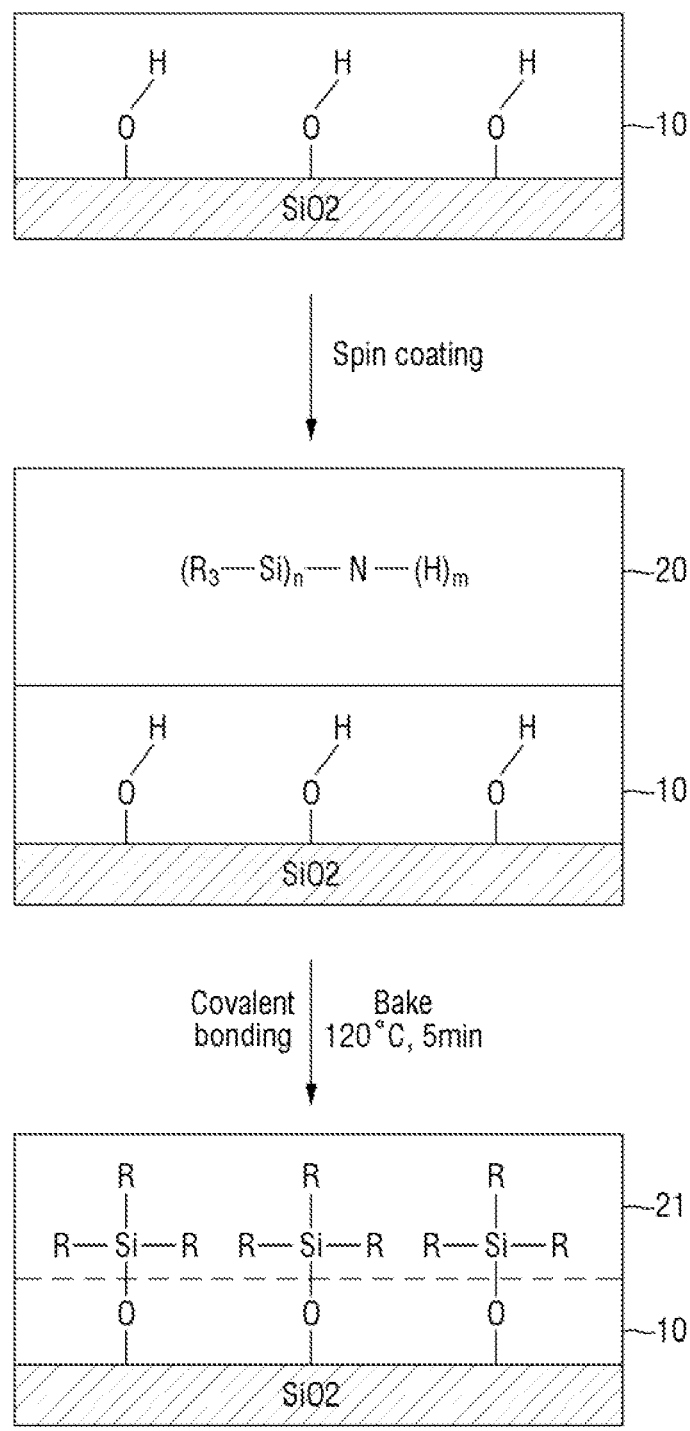

FIGS. 1 and 2 are intermediate stage diagrams of a coating process of the oxide film coating solution according to some embodiments. For reference, FIG. 1 is a coating process of the oxide film coating solution including a compound represented by Chemical Formula 1, and FIG. 2 is a coating process of the oxide film coating solution including a compound represented by Chemical Formula 2.

Referring to FIGS. 1 and 2, an oxide film 10 may be provided. The oxide film 10 may include, e.g., SiO$_2$ in which a hydroxy group (—OH) is bonded to the surface.

The oxide film coating solution may be applied onto the oxide film 10. The oxide film coating solution may be physically adsorbed to or on the oxide film 10. In an implementation, the coating layer 20 may be formed on the oxide film 10.

The oxide film coating solution may include a silane compound and an organic solvent. The silane compound may be a solute dissolved in the organic solvent. The organic solvent may be a solvent in which the silane compound is dissolved.

The silane compound may be a compound represented by, e.g., the following Chemical Formula 1 or Chemical Formula 2.

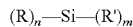  <Chemical Formula 1>

In Chemical Formula 1, R may be a, e.g., alkyl having a carbon number of, e.g., 1 to 20, amine, fluorine, chlorine, vinyl, sulfur, methacryl, acetoxy, isocyanurate, or alkyleneoxy group. R' may be a, e.g., alkyl, methoxy, ethoxy, chloro, or disilazane group. n and m may each independently be, e.g., an integer of 1 to 3, and n+m may be 4.

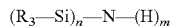  <Chemical Formula 2>

In Chemical Formula 2, R may be a, e.g., alkyl having carbon numbers of 1 to 20, amine, fluorine, chlorine, vinyl, sulfur, methacryl, acetoxy, isocyanurate, or alkyleneoxy group, and n and m may each independently be an integer of 0 to 3, and n+m may be 3.

The silane compound may be included in the coating solution in an amount of, e.g., about 5 wt % to about 8 wt %, based on 100 wt % of the oxide film coating solution.

In an implementation, the organic solvent may include, e.g., a ketone, a hydrocarbon, or an ether.

The coating layer 20 may be heat-treated after the oxide film coating solution is physically adsorbed. In an implementation, as shown in FIGS. 1 and 2, the heat treatment process may be performed, e.g., at a temperature of 120° C. for 5 minutes.

As the coating layer 20 is heat-treated, the coating layer 20 may be adsorbed to the upper surface of the oxide film 10. In an implementation, the coating layer 20 may form a covalent bond with the upper surface of the oxide film 10. The coating layer 20 may be chemically adsorbed (chemisorption) to the upper surface of the oxide film 10. In an implementation, a chemically adsorbed coating layer 21 that is chemically adsorbed to the upper surface of the oxide film 10 may be formed.

In an implementation, when the silane compound reacts with the hydroxy group (—OH) of the oxide film 10, silicon (Si) of the silane compound and oxygen (O) of the oxide film may form a bond.

In an implementation, as shown in FIG. 1, while the coating layer 20 is chemically adsorbed to the oxide film 10, R$_4$ and hydrogen (H) may be removed. R$_4$ and hydrogen (H) may be removed as a by-product of chemical adsorption.

In an implementation, as shown in FIG. 2, while the coating layer 20 is chemically adsorbed to the oxide film 10, N—(H)$_m$ and hydrogen (H) may be removed. N—(H)$_m$ and hydrogen (H) may be removed as by-products of chemical adsorption.

When the oxide film coating solution is applied on the oxide film 10, a membrane exposed to the oxide film coating solution may be various. For example, the membrane containing SiGe, Si, SiN, and SiO$_2$ may be exposed to the oxide film coating solution. However, the membrane on which the coating layer 20 is formed may be a membrane on which SiO$_2$ is exposed.

The semiconductor device according to some embodiments will be described referring to FIGS. 3 to 8.

Figure 3:
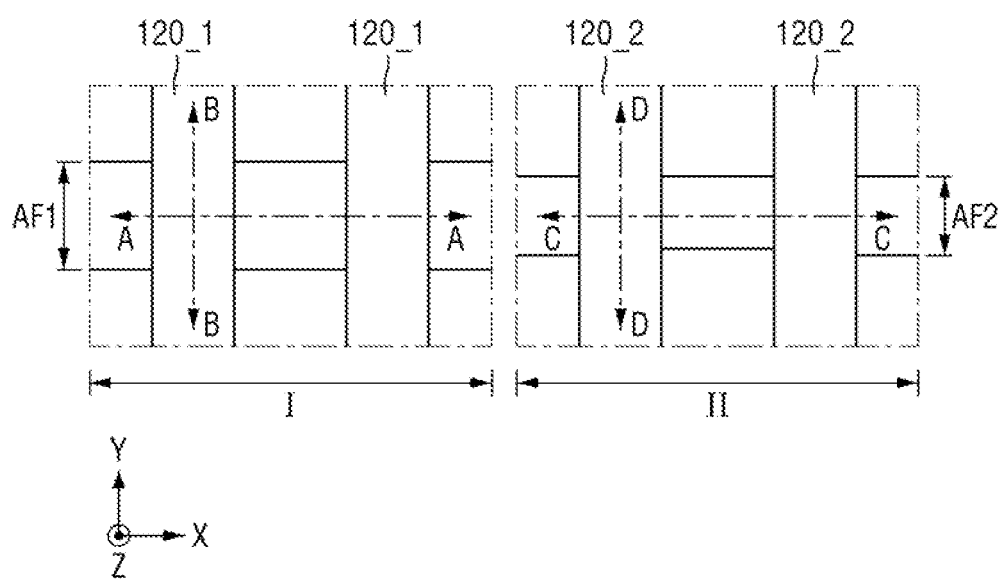
FIG. 3 is a diagram of a semiconductor device according to some embodiments.
Figure 4:
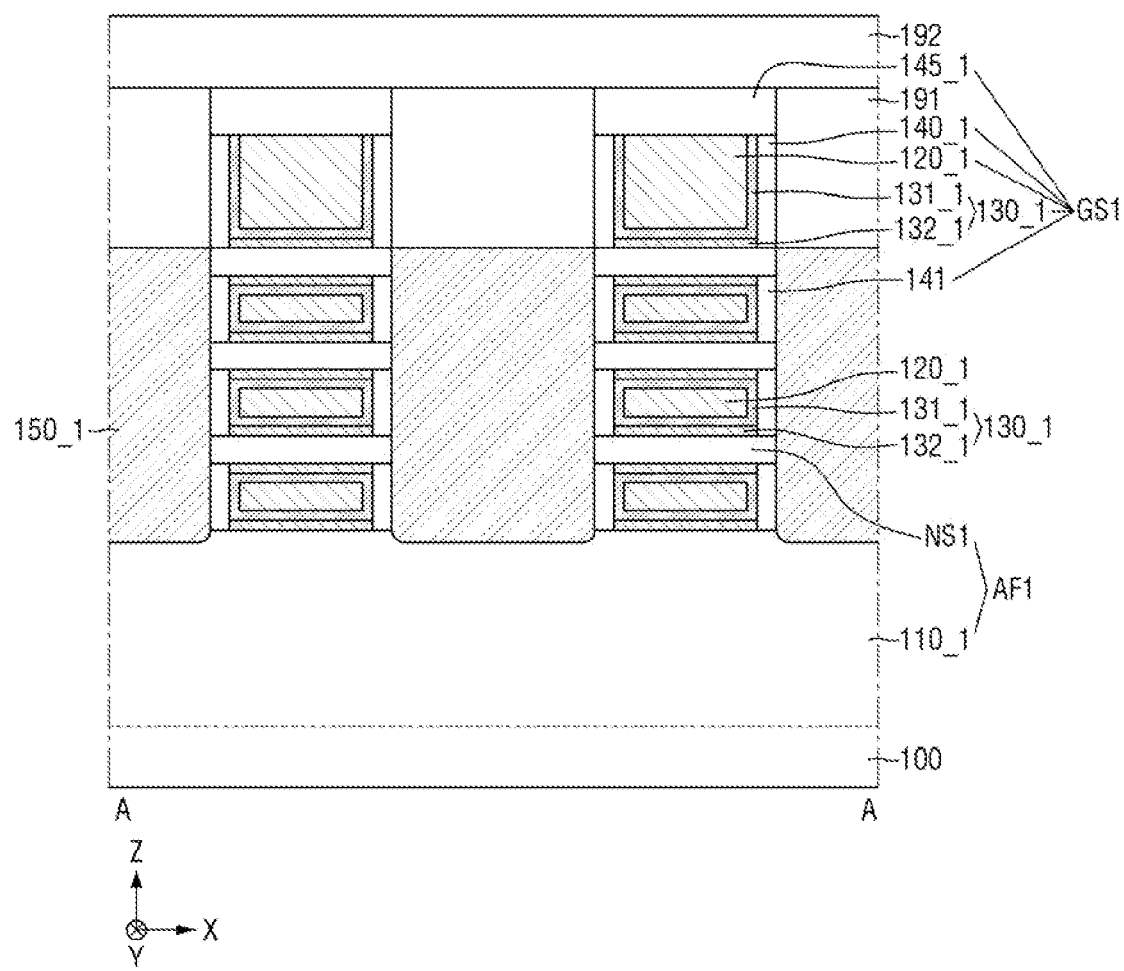
FIGS. 4 and 5 are cross-sectional views taken along A-A of FIG. 3.
Figure 5:
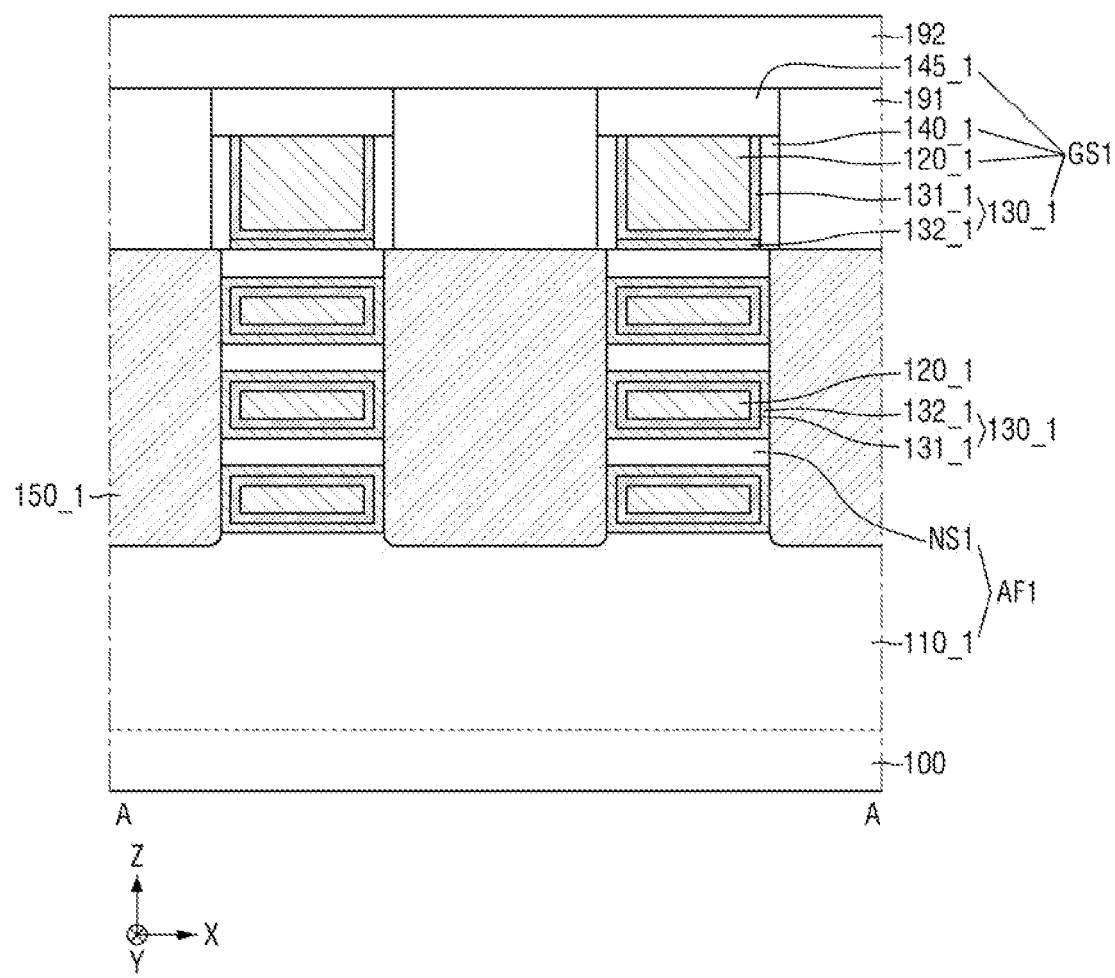
Figure 6:
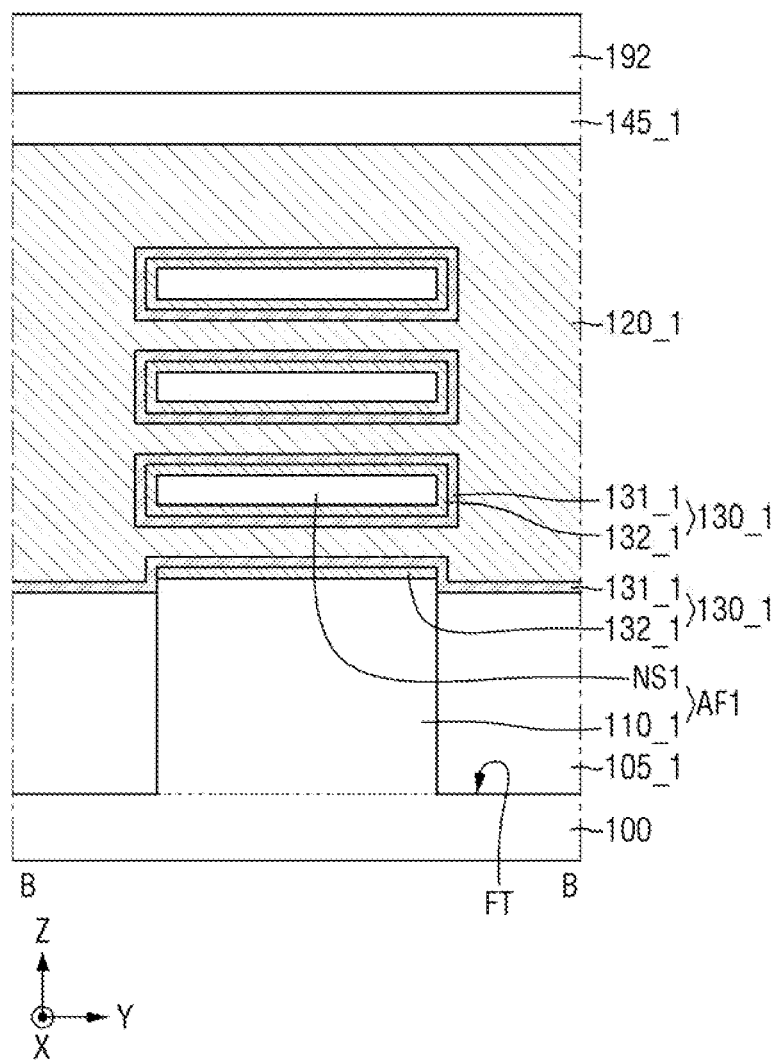
FIG. 6 is a cross-sectional view taken along B-B of FIG. 3.
Figure 7:
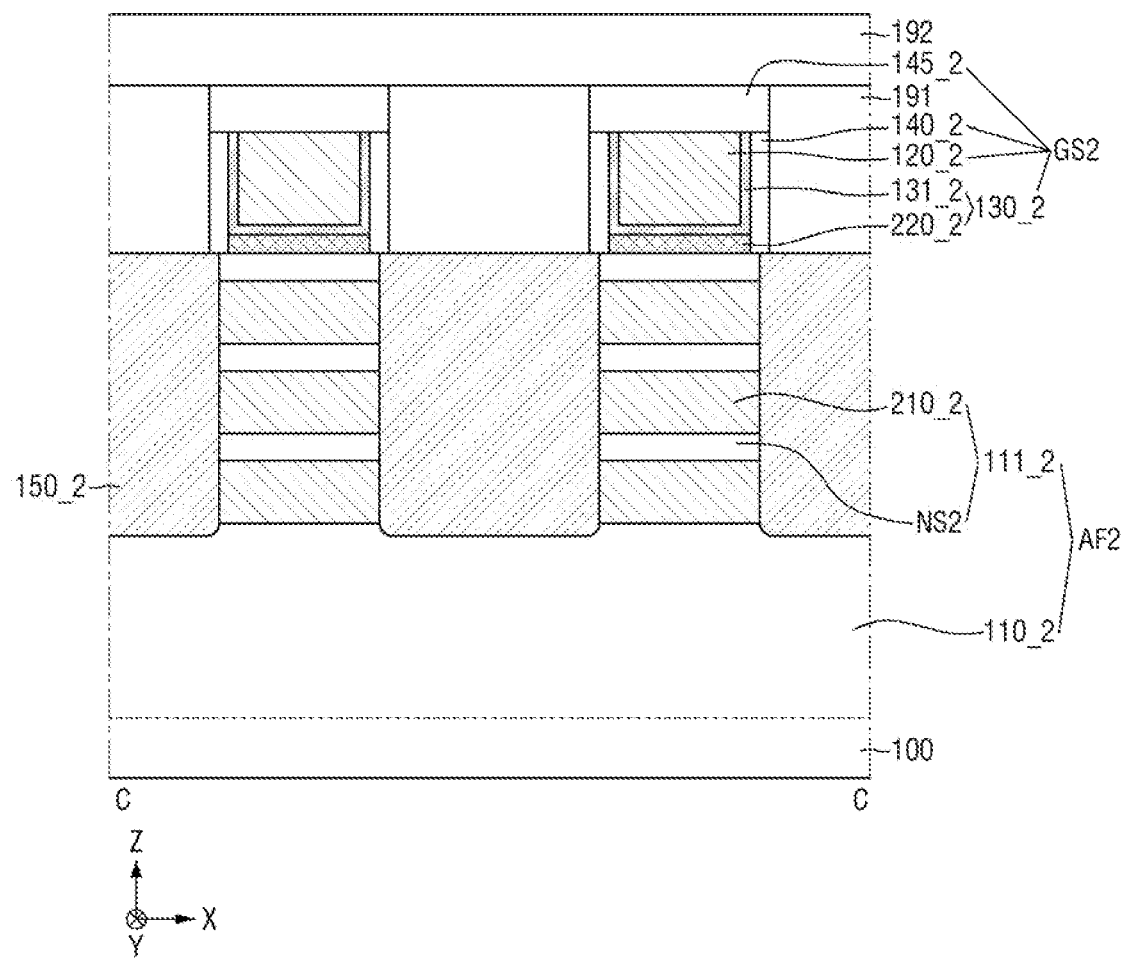
FIG. 7 is a cross-sectional view taken along C-C of FIG. 3.
Figure 8:
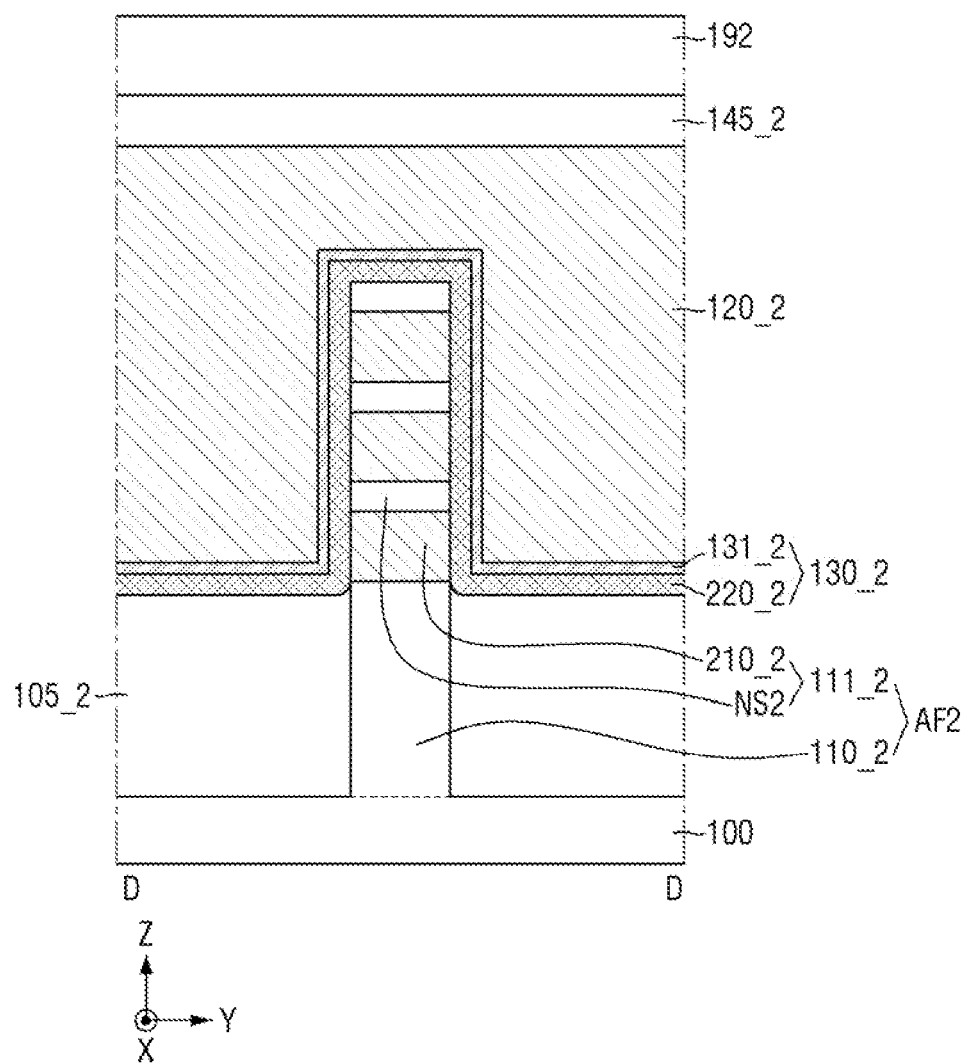
FIG. 8 is a cross-sectional view taken along D-D of FIG. 3.

FIG. 3 is a layout diagram of semiconductor device according to some embodiments. FIGS. 4 and 5 are cross-sectional views taken along A-A of FIG. 3. FIG. 6 is a cross-sectional view taken along B-B of FIG. 3. FIG. 7 is a cross-sectional view taken along C-C of FIG. 3. FIG. 8 is a cross-sectional view taken along D-D of FIG. 3.

Referring to FIGS. 3 to 8, the semiconductor devices according to some embodiments may include a first active pattern AF1, a second active pattern AF2, a plurality of first gate structures GS1, a plurality of second gate structures GS2, a first epitaxial pattern 150_1, and a second epitaxial pattern 150_2.

The substrate 100 may include a first region I and a second region II. The first region I may be, e.g., a low-voltage operating region. In an implementation, the first region I may be, e.g., a logic region or an SRAM region. The second region II may be, e.g., a high-voltage operating region. In an implementation, the second region II may be, e.g., an I/O region.

The substrate 100 may be bulk silicon or SOI (silicon-on-insulator). In an implementation, the substrate 100 may be a silicon substrate or may include other materials such as silicon germanium, SGOI (silicon germanium on insulator), indium antimonide, lead tellurium compounds, indium arsenide, indium phosphide, gallium arsenide or gallium antimonide.

The first active pattern AF1 may be on the substrate 100 on the first region I. The first active pattern AF1 may extend long or lengthwise in a first direction X.

In an implementation, the first active pattern AF1 may be a region in or on which PMOS is formed. In an implementation, the first active pattern AF1 may be a region in or on which NMOS is formed.

The first active pattern AF1 may include a first lower pattern 110_1 and a first sheet pattern NS1. The first sheet pattern NS1 may be a part of a first upper pattern 111_1 to be described in FIG. 9.

The first lower pattern 110_1 may be on the first region I. The first lower patterns 110_1 may be spaced apart from each other in a second direction Y. The first lower patterns 110_1 may protrude from the upper surface of the substrate 100.

The first lower patterns 110_1 may be separated by a fin trench FT extending in the first direction X. The first lower pattern 110_1 may include side walls opposite to each other. The side walls of the first lower pattern 110_1 may extend in the first direction X. The side walls of the first lower pattern 110_1 may each be defined by the fin trench FT.

A first sheet pattern NS1 may be on the substrate 100 on the first region I. The first sheet pattern NS1 may be spaced apart from the substrate 100 (e.g., in a third direction Z).

A plurality of first sheet patterns NS1 may be on the first lower pattern 110_1. The plurality of first sheet patterns NS1 may be spaced apart from the first lower pattern 110_1 in the third direction Z that intersects the first direction X and the second direction Y. The plurality of first sheet patterns NS1 may be spaced apart from each other in the third direction Z. The plurality of first sheet patterns NS1 spaced apart from each other may extend in the first direction X along the upper surface of the first lower pattern 110_1.

The second active pattern AF2 may be on the substrate 100 on the second region II. The second active pattern AF2 may extend long or lengthwise in the first direction X. In an implementation, the second active pattern AF2 may be a fin type pattern.

In an implementation, the second active pattern AF2 may be a region in or on which PMOS is formed. In an implementation, the second active pattern AF2 may be a region in or on which NMOS is formed.

The second active pattern AF2 may include a second lower pattern 110_2 and a second upper pattern 111_2.

The plurality of second lower patterns 110_2 may be on the second region II. The second lower patterns 110_2 may be spaced apart from each other in the second direction Y. The second lower patterns 110_2 may protrude from the upper surface of the substrate 100.

The second lower patterns 110_2 may be separated by the fin trench FT extending in the first direction X. The second lower patterns 110_2 may include side walls opposite to each other. The side walls of the second lower pattern 110_2 may extend in the first direction X. The side walls of the second lower pattern 110_2 may each be defined by the fin trench FT.

The second upper pattern 111_2 may be on the substrate 100 on the second region II. The second upper patterns 111_2 may be spaced apart from the substrate 100. The second upper pattern 111_2 may include a plurality of second sacrificial layers 210_2 and a plurality of second sheet patterns NS2.

The second upper pattern 111_2 may be spaced apart from the second lower pattern 110_2 in the third direction Z. The second upper patterns 111_2 may be spaced apart from each other in the third direction Z. The second upper patterns 111_2 spaced apart from each other may be arranged in the first direction X along the upper surface of the second lower pattern 110_2.

The second upper pattern 111_2 may be on the second lower pattern 110_2. The plurality of second sacrificial layers 210_2 and the plurality of second sheet patterns NS2 may be alternately stacked on the second lower pattern 110_2.

The second sacrificial layer 210_2 may be on the substrate 100 on the second region II. The plurality of second sacrificial layers 210_2 may be on the second lower pattern 110_2.

The plurality of second sacrificial layers 210_2 may be spaced apart from each other in the third direction Z. The plurality of second sacrificial layers 210_2 spaced apart from each other may extend in the first direction X along the upper surface of the second lower pattern 110_2.

The second sheet pattern NS2 may be on the substrate 100 on the second region II. The second sheet pattern NS2 may be spaced apart from the substrate 100.

The plurality of second sheet patterns NS2 may be on the first lower pattern 110_1. The plurality of second sheet patterns NS2 may be spaced apart from the second lower pattern 110_2 in the third direction Z. The plurality of second sheet patterns NS2 may be spaced apart from each other in the third direction Z. The plurality of second sheet patterns NS2 spaced apart from each other may extend in the first direction along the upper surface of the second lower pattern 110_2.

A first field insulating film 105_1 may be on the substrate 100 on the first region I. The first field insulating film 105_1 may fill at least a part of the fin trench FT.

The first field insulating film 105_1 may wrap at least a part of the side wall of the first lower pattern 110_1. The first lower pattern 110_1 may be defined by the first field insulating film 105_1.

A second field insulating film 105_2 may be on the substrate 100 on the second region II. The second field insulating film 105_2 may fill at least a part of the fin trench FT.

The second field insulating film 105_2 may wrap at least a part of the side wall of the second lower pattern 110_2. The second lower pattern 110_2 may be defined by the second field insulating film 105_2.

The first field insulating film 105_1 and the second field insulating film 105_2 may include, e.g., an oxide film, a nitride film, an oxynitride film, or a combination thereof A plurality of first gate structures GS1 may be on the substrate 100. Each first gate structure GS1 may extend in the second direction Y. Adjacent first gate structures GS1 may be spaced apart from each other in the first direction X.

The first gate structure GS1 may be on the first active pattern AF1. The first gate structure GS1 may intersect the first active pattern AF1. The first gate structure GS1 may wrap each first sheet pattern NS1.

The first gate structure GS1 may include, e.g., a first gate electrode 120_1, a first gate insulating film 130_1, a first outer spacer 140_1, an inner spacer 141, and a first gate capping pattern 145_1.

The plurality of first gate electrodes 120_1 may be on the substrate 100 on the first region I. The first gate electrode 120_1 may be on the first lower pattern 110_1.

Each first gate electrode 120_1 may extend in the second direction Y that intersects the first direction X. Each first gate electrode 120_1 may spaced apart from each other in the first direction X.

The first gate electrode 120_1 may be on a first gate insulating film 130_1 to be described below. Each first gate electrode 120_1 may intersect the first active pattern AF1. Each first gate electrode 120_1 may wrap each first sheet pattern NS1.

The first gate electrode 120_1 may include, e.g., a metal, a metal alloy, a conductive metal nitride, a metal silicide, a doped semiconductor material, a conductive metal oxide, or a conductive metal oxynitride. The first gate electrode 120_1 may include, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof. The conductive metal oxide and conductive metal oxynitride may include, e.g., oxidized forms of the materials described above.

In an implementation, as illustrated in the drawings, two first gate electrodes 120_1 may be present. In an implementation, the number of first gate electrodes 120_1 may be larger or smaller than two.

The first gate insulating film 130_1 may wrap around the first sheet pattern NS1. The first gate insulating film 130_1 may include a first high-dielectric constant insulating film 131_1 and a first interfacial insulating film 132_1.

The first high-dielectric constant insulating film 131_1 may be on the substrate 100 on the first region I. The first high-dielectric constant insulating film 131_1 may be on the first interfacial insulating film 132_1. The first high-dielectric constant insulating film 131_1 may extend along the upper surface of the first lower pattern 110_1 of the first region I.

The first high-dielectric constant insulating film 131_1 may wrap each first sheet pattern NS1. The first interfacial insulating film 132_1 may be between the first high-dielectric constant insulating film 131_1 and each first sheet pattern NS1. The first high-dielectric constant insulating film 131_1 may wrap the first gate electrode 120_1. The first high-dielectric constant insulating film 131_1 may be along the periphery of the first interfacial insulating film 132_1.

In an implementation, the first high-dielectric constant insulating film 131_1 may include a high-dielectric constant material, e.g., boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The first interfacial insulating film 132_1 may be on the substrate 100 on the first region I. The first interfacial insulating film 132_1 may be along the periphery of each first sheet pattern NS1. The first interfacial insulating film 132_1 may be between the first gate electrodes 120_1.

The first interfacial insulating film 132_1 may extend along the upper surface of the first lower pattern 110_1. The first interfacial insulating film 132_1 may extend along the first direction X.

As shown in FIGS. 4 and 5, on the first region I, the first interfacial insulating film 132_1 may be along the upper surface of an uppermost first sheet pattern NS1.

In an implementation, the placement of the first interfacial insulating film 132_1 may differ depending on the forming method. In an implementation, the first interfacial insulating film 132_1 may be along the upper surface of the uppermost first sheet pattern NS1 and along an inner side wall of the first outer spacer 140_1.

The first interfacial insulating film 132_1 may include an insulating material, e.g., a silicon oxide.

The semiconductor device according to some embodiments may include an NC (Negative Capacitance) FET that uses a negative capacitor. In an implementation, the first gate insulating film 130_1 may include a ferroelectric material film having ferroelectric properties, and a paraelectric material film having paraelectric properties.

The ferroelectric material film may have a negative capacitance, and the paraelectric material film may have a positive capacitance. In an implementation, if two or more capacitors are connected in series and the capacitance of each capacitor has a positive value, the overall capacitances decrease from the capacitance of each of the individual capacitors. In an implementation, if at least one of the capacitances of two or more capacitors connected in series has a negative value, the overall capacitances may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) below 60 mV/decade at room temperature.

The ferroelectric material film may have ferroelectric properties. The ferroelectric material film may include, e.g., hafnium oxide, hafnium zirconium oxide, barium strontium titanium oxide, barium titanium oxide, or lead zirconium titanium oxide. In an implementation, the hafnium zirconium oxide may be a material obtained by doping hafnium oxide with zirconium (Zr). In an implementation, the hafnium zirconium oxide may be a compound of hafnium (Hf), zirconium (Zr), and oxygen (O).

The ferroelectric material film may further include a doped dopant. In an implementation, the dopant may include, e.g., aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, e.g., gadolinium (Gd), silicon (Si), zirconium (Zr), aluminum (Al), or yttrium (Y).

In an implementation, when the dopant is aluminum (Al), the ferroelectric material film may include 3 to 8 at % (atomic %) aluminum. Here, a ratio of the dopant may be a ratio of aluminum to the sum of hafnium and aluminum.

In an implementation, when the dopant is silicon (Si), the ferroelectric material film may include 2 to 10 at % silicon. In an implementation, when the dopant is yttrium (Y), the ferroelectric material film may include 2 to 10 at % yttrium. In an implementation, when the dopant is gadolinium (Gd), the ferroelectric material film may include 1 to 7 at % gadolinium. In an implementation, when the dopant is zirconium (Zr), the ferroelectric material film may include 50 to 80 at % zirconium.

The paraelectric material film may have the paraelectric properties. The paraelectric material film may include, e.g., a silicon oxide or a metal oxide having a high dielectric constant. The metal oxide included in the paraelectric material film may include, e.g., hafnium oxide, zirconium oxide, or aluminum oxide.

The ferroelectric material film and the paraelectric material film may include the same material. The ferroelectric material film may have the ferroelectric properties, and the paraelectric material film may not have the ferroelectric properties. In an implementation, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. In an implementation, a thickness of the ferroelectric material film may be, e.g., 0.5 to 10 nm. A critical thickness that exhibits the ferroelectric properties may vary for each ferroelectric material, and the thickness of the ferroelectric material film may vary depending on the ferroelectric material.

In an implementation, the first gate insulating film 130_1 may include a single ferroelectric material film. In an implementation, the first gate insulating film 130_1 may include a plurality of ferroelectric material films spaced apart from each other. The first gate insulating film 130_1 may have a stacked film structure in which a plurality of ferroelectric material films and a plurality of paraelectric material films are alternately stacked.

The first outer spacer 140_1 may be on the side wall of the first gate electrode 120_1.

The first outer spacer 140_1 may include, e.g., silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), or combinations thereof.

The inner spacer 141 may be between the first sheet patterns NS1 adjacent to each other the third direction Z or in the first direction X. In an implementation, as shown in FIG. 5, the semiconductor device according to some embodiments may not include the inner spacer 141. In an implementation, as shown in FIG. 4, the semiconductor device according to some embodiments may include the inner spacer 141.

The inner spacer 141 may include, e.g., silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), or combinations thereof.

The first gate capping pattern 145_1 may be on the first gate electrode 120_1, the first high-dielectric constant insulating film 131_1, and the first outer spacer 140_1. The upper surface of the first gate capping pattern 145_1 may be on a same plane as the upper surface of the first interlayer insulating film 191.

The first gate capping pattern 145_1 may include, e.g., silicon nitride (SiN), silicon oxynitride (SiON), silicon oxide (SiO$_2$), silicon carbonitride (SiCN), silicon oxycarbonitride (SiOCN), or combinations thereof.

The plurality of second gate structures GS2 may be on the substrate 100. Each second gate structure GS2 may extend in the second direction Y. Adjacent second gate structures GS2 may be spaced apart from each other in the first direction X.

The second gate structure GS2 may be on the second active pattern AF2. The second gate structure GS2 may intersect the second active pattern AF2.

The second gate structure GS2 may include, e.g., a second gate electrode 120_2, a second gate insulating film 130_2, a second outer spacer 140_2, and a second gate capping pattern 145_2.

The plurality of second gate electrodes 120_2 may be on the substrate 100 on the second region II. The second gate electrode 120_2 may be on the second upper pattern 111_2.

Each second gate electrode 120_2 may extend in the second direction Y. Each second gate electrode 120_2 may be spaced apart in the first direction X.

The second gate electrode 120_2 may be on a second gate insulating film 130_2 to be described below. Each second gate electrode 120_2 may intersect the second active pattern AF2.

The second gate electrode 120_2 may include, e.g., a metal, a metal alloy, a conductive metal nitride, a metal silicide, a doped semiconductor material, a conductive metal oxide, or a conductive metal oxynitride. The second gate electrode 120_2 may include, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof. The conductive metal oxide and conductive metal oxynitride may include, e.g., oxidized forms of the aforementioned materials.

In an implementation, as illustrated in the drawings, two second gate electrodes 120_2 may be present. In an implementation, the number of second gate electrodes 120_2 may be larger or smaller than two.

The second gate insulating film 130_2 may include a second high-dielectric constant insulating film 131_2 and a second insulating liner 220_2.

The second high-dielectric constant insulating film 131_2 may be on the substrate 100 on the second region II. The second high-dielectric constant insulating film 131_2 may be on the second insulating liner 220_2. The second high-dielectric constant insulating film 131_2 may extend along the upper surface of the second lower pattern 110_2 of the second region II. The second high-dielectric constant insulating film 131_2 may wrap the second gate electrode 120_2.

In an implementation, the second high-dielectric constant insulating film 131_2 may include high-dielectric constant materials, e.g., boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The second insulating liner 220_2 may be on the substrate 100 on the second region II. As shown in FIGS. 7 and 8, on the second region II, the second insulating liner 220_2 may be along an upper surface of an uppermost second sheet pattern NS2. The second insulating liner 220_2 may extend along the first direction X.

The second insulating liner 220_2 may extend along the profile of the upper surface of the second field insulating film 105_2 and the second upper pattern 111_2.

In an implementation, the placement of the second insulating liner 220_2 may differ depending on the forming method. In an implementation, the second insulating liner 220_2 may be along the upper surface of the uppermost second sheet pattern NS2 and the inner wall of the second outer spacer 140_2.

The second insulating liner 220_2 may include an insulating material, e.g., a silicon oxide.

As described in the first gate insulating film 130_1, the second gate insulating film 130_2 may include a ferroelectric material film having the ferroelectric properties, and a paraelectric material film having the paraelectric properties.

The second outer spacer 140_2 may be on the side wall of the second gate electrode 120_2.

The second outer spacer 140_2 may include, e.g., silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), or combinations thereof.

The second gate capping pattern 145_2 may be on the second gate electrode 120_2, the second gate insulating film 130_2 and the second outer spacer 140_2. The upper surface of the second gate capping pattern 145_2 may be on a same plane as the upper surface of the first interlayer insulating film 191.

The second gate capping pattern 145_2 may include, e.g., silicon nitride (SiN), silicon oxynitride (SiON), silicon oxide ($SiO_2$), silicon carbonitride (SiCN), silicon oxycarbonitride (SiOCN), or combinations thereof.

A plurality of first epitaxial patterns 150_1 may be included in a source/drain of a transistor that uses the first sheet pattern NS1 as the channel region.

The plurality of first epitaxial patterns 150_1 may be on the first lower pattern 110_1 on the first region I. The plurality of first epitaxial patterns 150_1 may be between the first gate electrodes 120_1 adjacent to each other in the first direction X. Each first epitaxial pattern 150_1 may be connected to the first sheet pattern NS1 adjacent in the first direction X.

In an implementation, a source/drain contact may be on the plurality of first epitaxial patterns 150_1. In an implementation, a metal silicide film may be further included between the source/drain contact and the first epitaxial pattern 150_1.

The plurality of second epitaxial patterns 150_2 may be included in the source/drain of a transistor that uses the second sheet pattern NS2 as the channel region.

The plurality of second epitaxial patterns 150_2 may be on the second lower pattern 110_2 on the second region II. The plurality of second epitaxial patterns 150_2 may be between the second upper patterns 111_2 adjacent to each other in the first direction X. Each second epitaxial pattern 150_2 may be connected to the second sheet pattern NS2 adjacent in the first direction X.

In an implementation, a source/drain contact may be on the plurality of second epitaxial patterns 150_2. In an implementation, a metal silicide film may be further included between the source/drain contact and the second epitaxial pattern 150_2.

The first interlayer insulating film 191 may cover the side walls of the first outer spacer 140_1 and the second outer spacer 140_2. The first interlayer insulating film 191 may cover the side walls of the first gate capping pattern 145_1 and the second gate capping pattern 145_2. The first interlayer insulating film 191 may be on the first epitaxial pattern 150_1 and the second epitaxial pattern 150_2.

The second interlayer insulating film 192 may be on the first interlayer insulating film 191, the first gate capping pattern 145_1, and the second gate capping pattern 145_2.

The first interlayer insulating film 191 and the second interlayer insulating film 192 may include, e.g., silicon oxide, silicon nitride, silicon oxynitride, FOX (Flowable Oxide), TOSZ (Tonen SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, or combinations thereof.

FIGS. 9 to 17 are intermediate stage diagrams of stages in a method for manufacturing the semiconductor device according to some embodiments. Repeated description of the above-described embodiment may be simplified or omitted.

Figure 9:
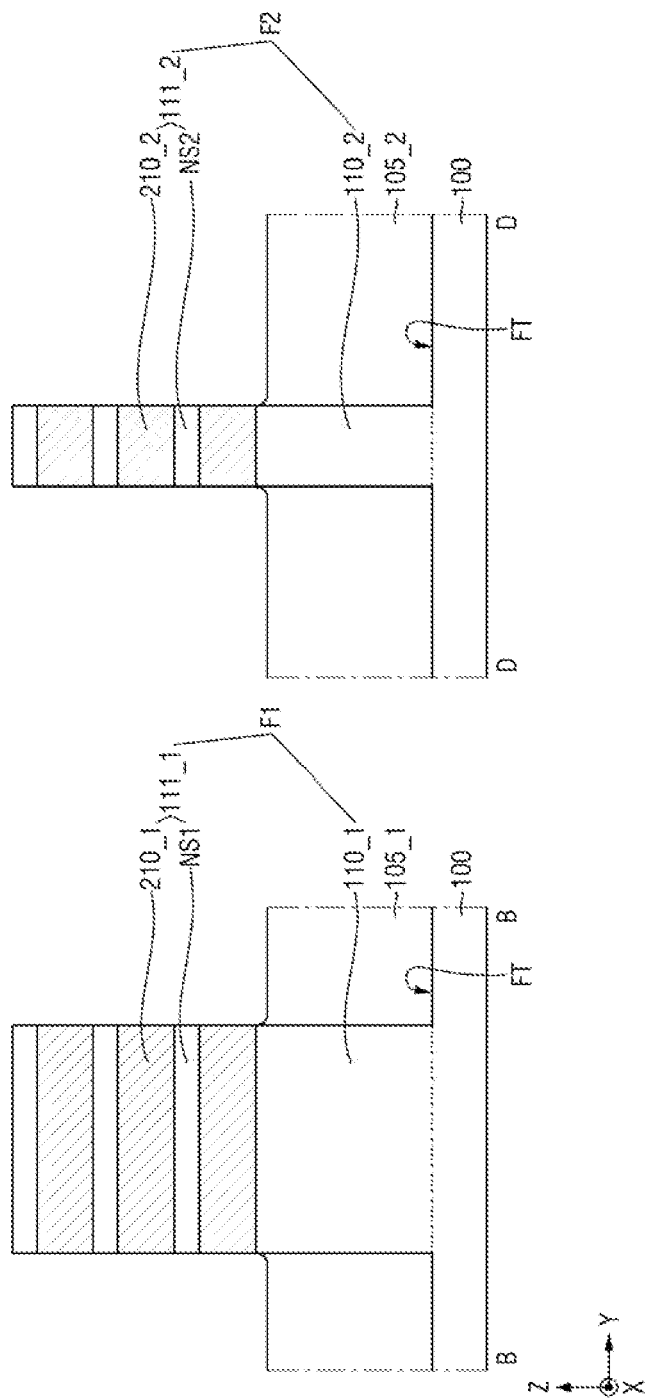
FIGS. 9 to 17 are diagrams of stages in a method for manufacturing the semiconductor device according to some embodiments.

Referring to FIG. 9, in the method for manufacturing the semiconductor device according to some embodiments, a first fin type pattern F1 may be formed on the substrate 100 on the first region I, and a second fin type pattern F2 may be formed on the substrate 100 on the second region II.

The first fin type pattern F1 may include a first lower pattern 110_1 and a first upper pattern 111_1, and the second fin type pattern F2 may include a second lower pattern 110_2 and a second upper pattern 111_2.

The first lower pattern 110_1 and the second lower pattern 110_2 may protrude from the upper surface of the substrate 100.

The first lower pattern 110_1 may include side walls opposite to each other. The first field insulating film 105_1 may wrap or surround at least a part of the side walls of the first lower pattern 110_1. The first lower pattern 110_1 may be defined by the first field insulating film 105_1.

The second lower pattern 110_2 may include side walls opposite to each other. The second field insulating film 105_2 may wrap at least a part of the side walls of the second lower pattern 110_2. The second lower pattern 110_2 may be defined by the second field insulating film 105_2.

The first upper pattern 111_1 and the second upper pattern 111_2 may be formed on the first lower pattern 110_1 and the second lower pattern 110_2, respectively.

The first upper pattern 111_1 may include a plurality of first sacrificial layers 210_1 and first sheet patterns NS1 alternately stacked on the first lower pattern 110_1. The second upper pattern 111_2 may include a plurality of second sacrificial layers 210_2 and second sheet patterns NS2 alternately stacked on the second lower pattern 110_2.

In an implementation, as illustrated in FIGS. 9 to 17, a width of the first active pattern AF1 in the second direction Y may be greater than a width of the second active pattern AF2 in the second direction Y.

Figure 10:
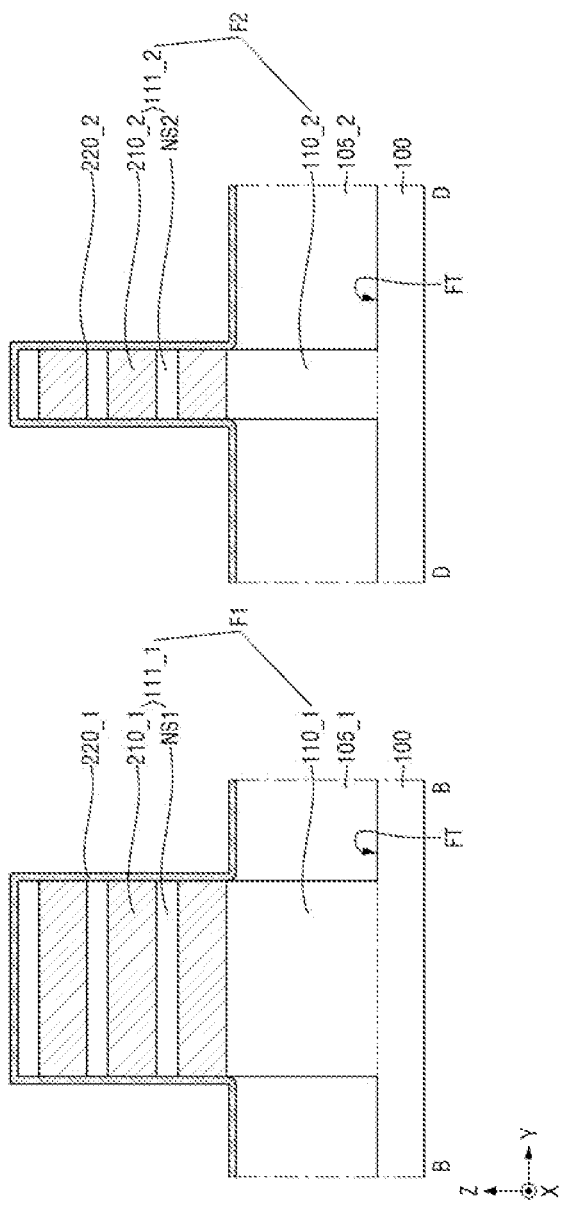

Referring to FIG. 10, a first insulating liner 220_1 may be formed on the substrate 100 on the first region I, and a second insulating liner 220_2 may be formed on the substrate 100 on the second region II.

The first insulating liner 220_1 may be formed on the first field insulating film 105_1. The first insulating liner 220_1 may be formed along the profile of the upper surface of the first field insulating film 105_1 and the first upper pattern 111_1.

The second insulating liner 220_2 may be formed on the second field insulating film 105_2. The second insulating liner 220_2 may be formed along the profile of the upper surface of the second field insulating film and the second upper pattern 111_2.

In an implementation, the first insulating liner 220_1 and the second insulating liner 220_2 may be formed at the same time.

Figure 11:
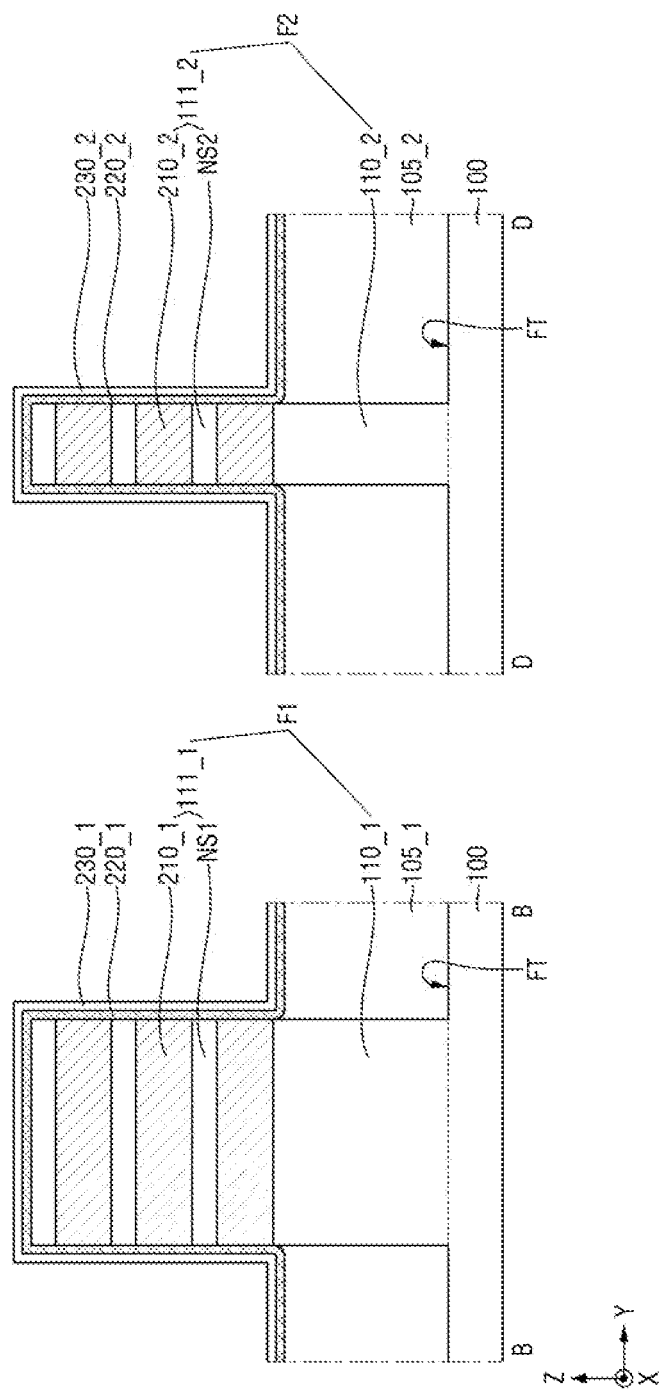

Referring to FIG. 11, a first passivation film 230_1 may be formed on the substrate 100 on the first region I, and a second passivation film 230_2 may be formed on the substrate 100 on the second region II.

The first passivation film 230_1 may be formed on the first field insulating film 105_1 and the first insulating liner 220_1. The first passivation film 230_1 may be formed along the profile of the first insulating liner 220_1.

The second passivation film 230_2 may be formed on the second field insulating film 105_2 and the second insulating liner 220_2. The second passivation film 230_2 may be formed along the profile of the second insulating liner 220_2. Accordingly, the second insulating liner 220_2 may not be exposed.

In an implementation, the first passivation film 230_1 and the second passivation film 230_2 may be formed at the same time.

In other methods, an oxide film coating solution may be applied onto the first insulating liner 220_1 and the second insulating liner 220_2, and a membrane or surface exposed to the oxide film coating solution may vary or be non-uniform. For example, a membrane or surface including SiGe, Si, SiN, and $SiO_2$ may be exposed to an oxide film coating solution. In an implementation, the membrane or surface on which the first passivation film 230_1 and the second passivation film 230_2 are formed may be the first insulating liner 220_1 and the second insulating liner 220_2, which (e.g., uniformly) include $SiO_2$.

The method for manufacturing the first passivation film 230_1 and the second passivation film 230_2 may be the same as the coating process of the oxide film coating solution described in FIG. 1. In an implementation, the first passivation film 230_1 and the second passivation film 230_2 may be the chemically adsorbed coating layer 21 shown in FIG. 1.

Figure 12:
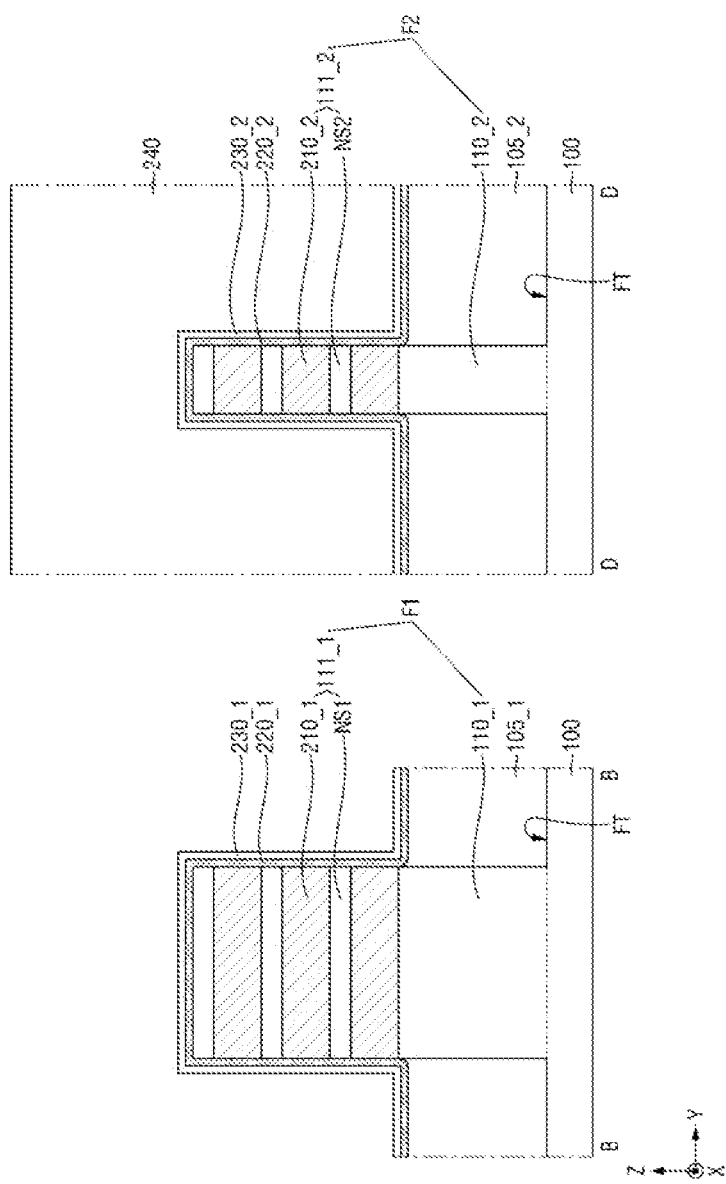

Referring to FIG. 12, a mask layer 240 may be formed on the substrate 100 on the second region II. The mask layer 240 may not be formed on the substrate 100 on the first region I.

The mask layer 240 may be formed on the second passivation film 230_2. The mask layer 240 may cover the second passivation film 230_2.

Figure 13:
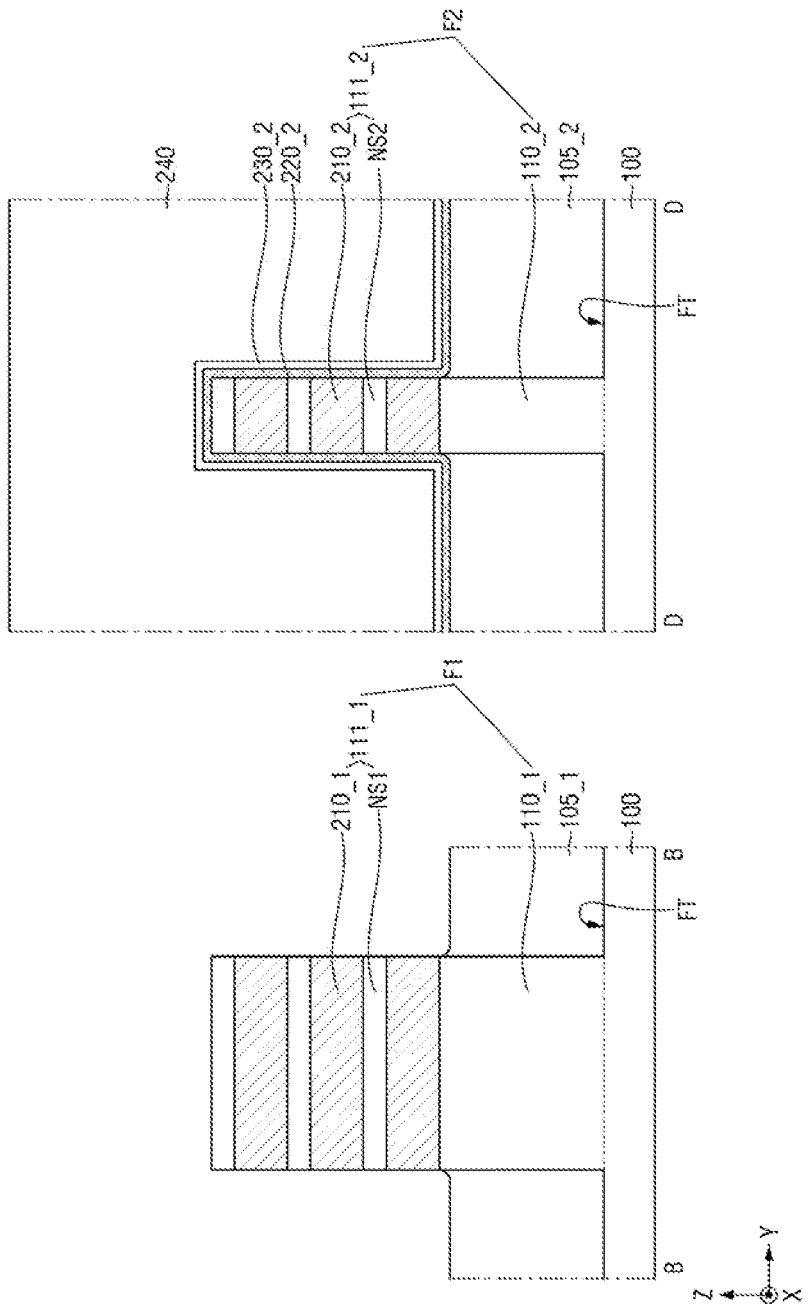

Referring to FIG. 13, the first etching process may be performed on the substrate 100 on the first region I exposed by the mask layer 240.

The first passivation film 230_1 and the first insulating liner 220_1 may be removed through the first etching process.

While the first etching process is performed, the second passivation film 230_2 and the second insulating liner 220_2 may be protected by the mask layer 240. Accordingly, the second passivation film 230_2 and the second insulating liner 220_2 may not be removed.

Figure 14:
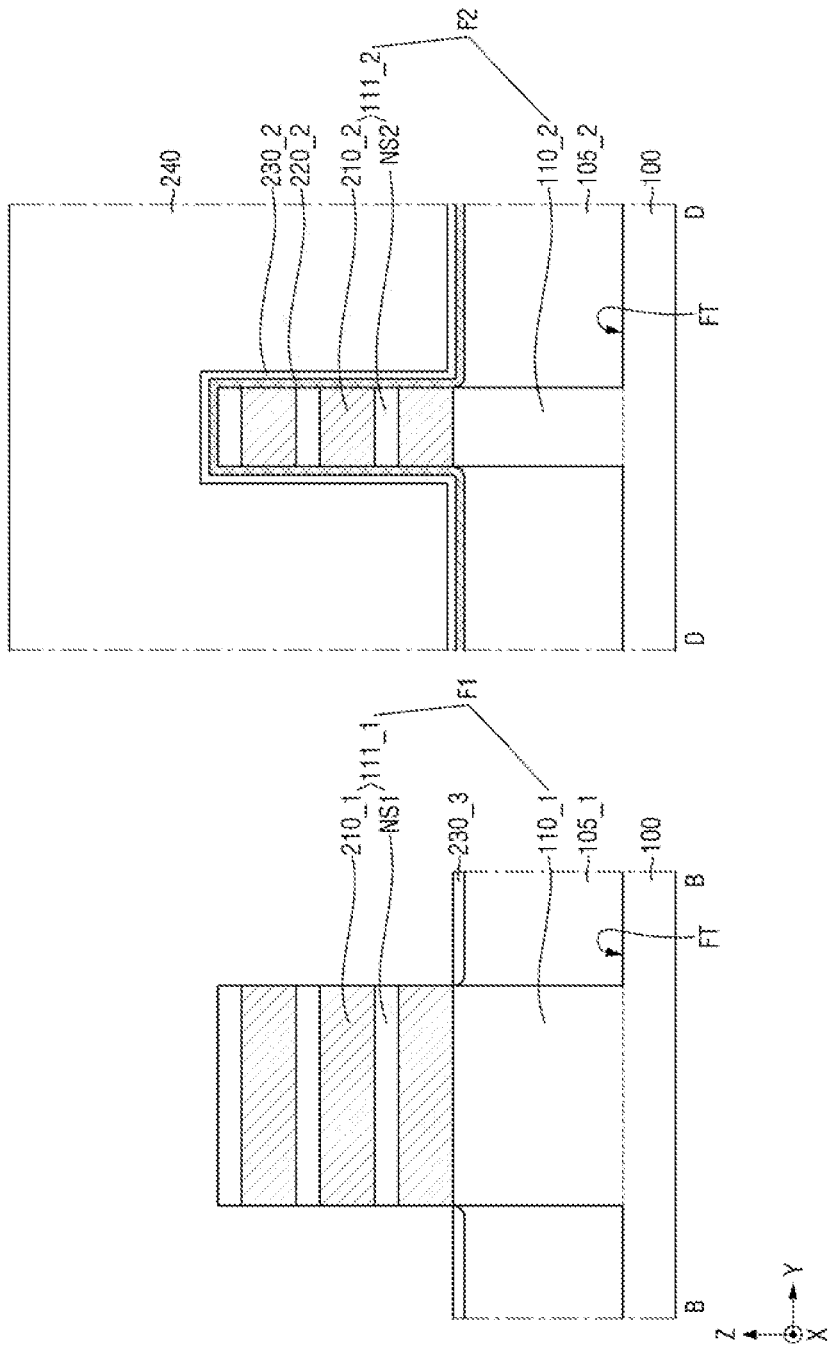

Referring to FIG. 14, a third passivation film 230_3 may be formed on the substrate 100 on the first region I.

The third passivation film 230_3 may not be formed on the substrate 100 on the second region II. The third passivation film 230_3 may be formed on the substrate 100 on the first region I exposed by the mask layer 240.

The third passivation film 230_3 may be formed on the first field insulating film 105_1. The third passivation film 230_3 may cover the upper surface of the first field insulating film 105_1. The third passivation film 230_3 may extend along the upper surface of the first field insulating film. Accordingly, the upper surface of the first field insulating film 105_1 may not be exposed.

The method for manufacturing the third passivation film 230_3 may be the same as the coating process of the oxide film coating solution described in FIG. 1. In an implementation, the third passivation film 230_3 may be chemically adsorbed coating layer 21 shown in FIG. 1.

In an implementation, the third passivation film 230_3 may not be formed on the first upper pattern 111_1. In an implementation, when the oxide film coating solution is applied onto the first field insulating film 105_1, the membrane or surface exposed to the oxide film coating solution may vary. In an implementation, the membrane or surface including SiGe, Si, SiN and $SiO_2$ may be exposed to the oxide film coating solution. In an implementation, the membrane or surface on which the third passivation film 230_3 is formed may be (e.g., only) be the first field insulating film 105_1, which may include $SiO_2$.

The third passivation film 230_3 may be in contact (e.g., direct contact) with the upper surface of the first field insulating film 105_1 and may not be in contact with the side surfaces of the plurality of first sacrificial layers. In an implementation, the first sacrificial layer 210_1 may be removed in a subsequent process to be described below.

Figure 15:
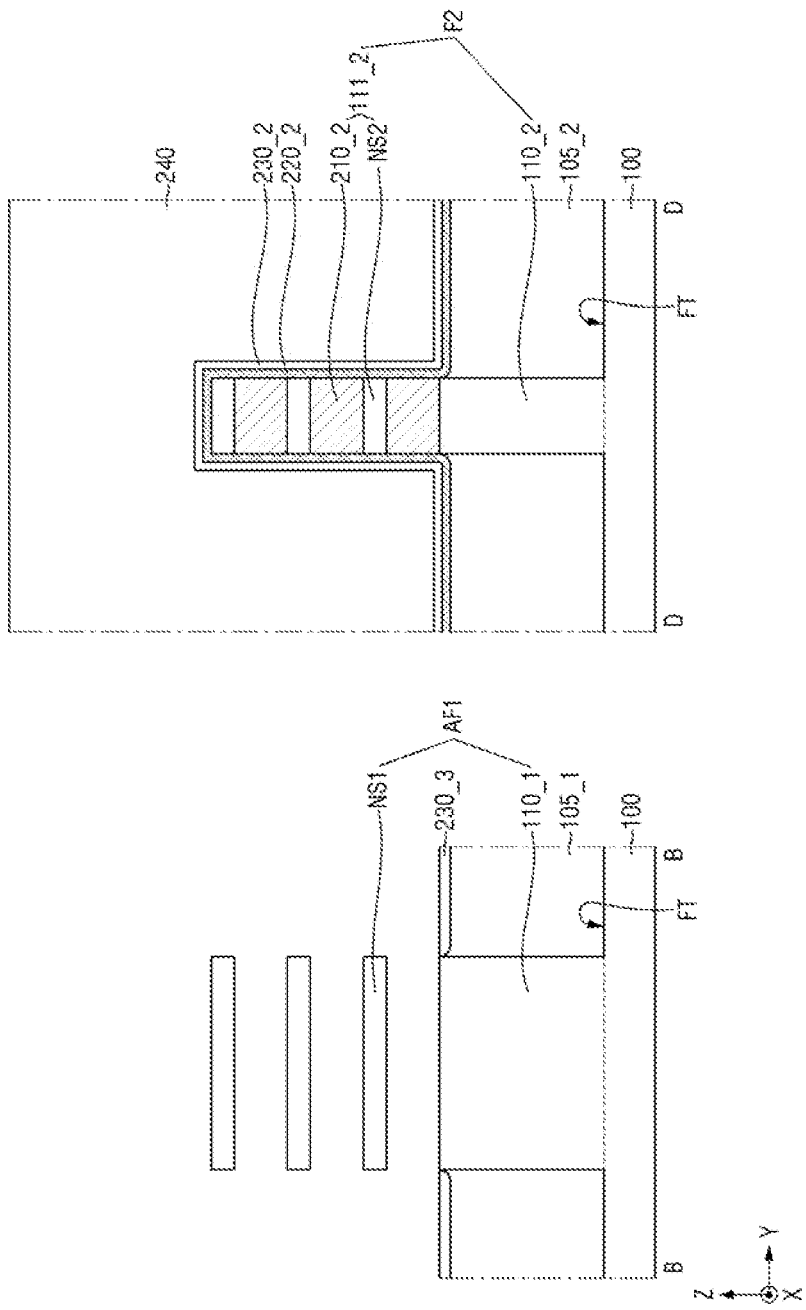

Referring to FIG. 15, a second etching process may be performed on the substrate 100 on the first region I exposed by the mask layer 240.

The first sacrificial layer 210_1 may be removed through the second etching process. By removing the first sacrificial layer 210_1, the first active pattern AF1 including the first lower pattern 110_1 and the first sheet pattern NS1 may be formed on the first region of the substrate 100. The second etching process of removing the first sacrificial layer 210_1 may be performed after the third passivation film 230_3 is formed.

The first field insulating film 105_1 may be protected by the third passivation film 230_3 on the substrate 100 on the first region I, while the second etching process is performed. Accordingly, the first field insulating film 105_1 may not be removed.

The second passivation film 230_2 and the second insulating liner 220_2 may be protected by the mask layer 240 on the substrate 100 on the second region II, while the second etching process is performed.

In an implementation, the etching solution of the second etching process could penetrate the mask layer 240 to reach the second passivation film 230_2. In an implementation, the second insulating liner 220_2 may be protected by the second passivation film 230_2. The etching solution of the second etching process may not penetrate the second passivation film 230_2. In an implementation, the second passivation film 230_2 and the second insulating liner 220_2 may not be removed.

The etching solution of the second etching process may oxidize and etch silicon germanium (SiGe). In an implementation, the etching solution may include, e.g., hydrogen fluoride (HF) and percetic acid.

Figure 16:
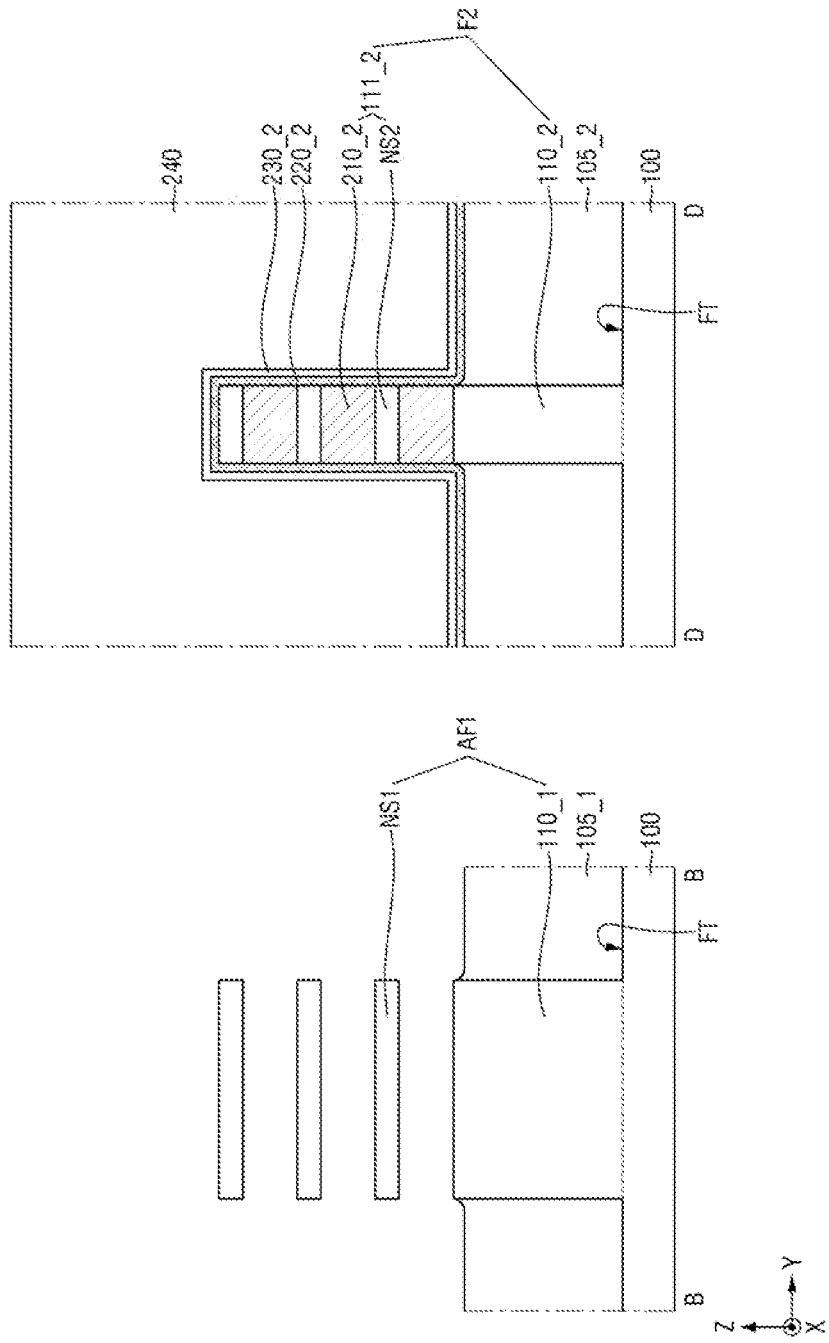

Referring to FIG. 16, a third etching process may be performed on the substrate 100 on the first region I exposed by the mask layer 240.

The third passivation film 230_3 may be removed through the third etching process.

While the third etching process is performed, the second passivation film 230_2 and the second insulating liner 220_2 may be protected by the mask layer 240. In an implementation, the second passivation film 230_2 and the second insulating liner 220_2 may not be removed.

Referring to FIGS. 4 to 8 and 17, a fourth etching process may be performed on the substrate 100 on the second region II.

The mask layer 240 and the second passivation film 230_2 may be removed through the fourth etching process. In an implementation, the second active pattern AF2 may be formed in the second region of the substrate 100. The second active pattern AF2 may be substantially the same as the second fin type pattern F2 of FIG. 16.

In an implementation, the mask layer 240 may be removed first. After the mask layer 240 is removed, the second passivation film 230_2 may be removed.

After the second passivation film 230_2 is removed, a first gate electrode 120_1 that intersects the first lower pattern 110_1 may be formed on the substrate 100 on the first region I. After the second passivation film 230_2 is removed, a second gate electrode 120_2 that intersects the second lower pattern 110_2 may be formed on the substrate 100 on the second region II.

Figure 17:
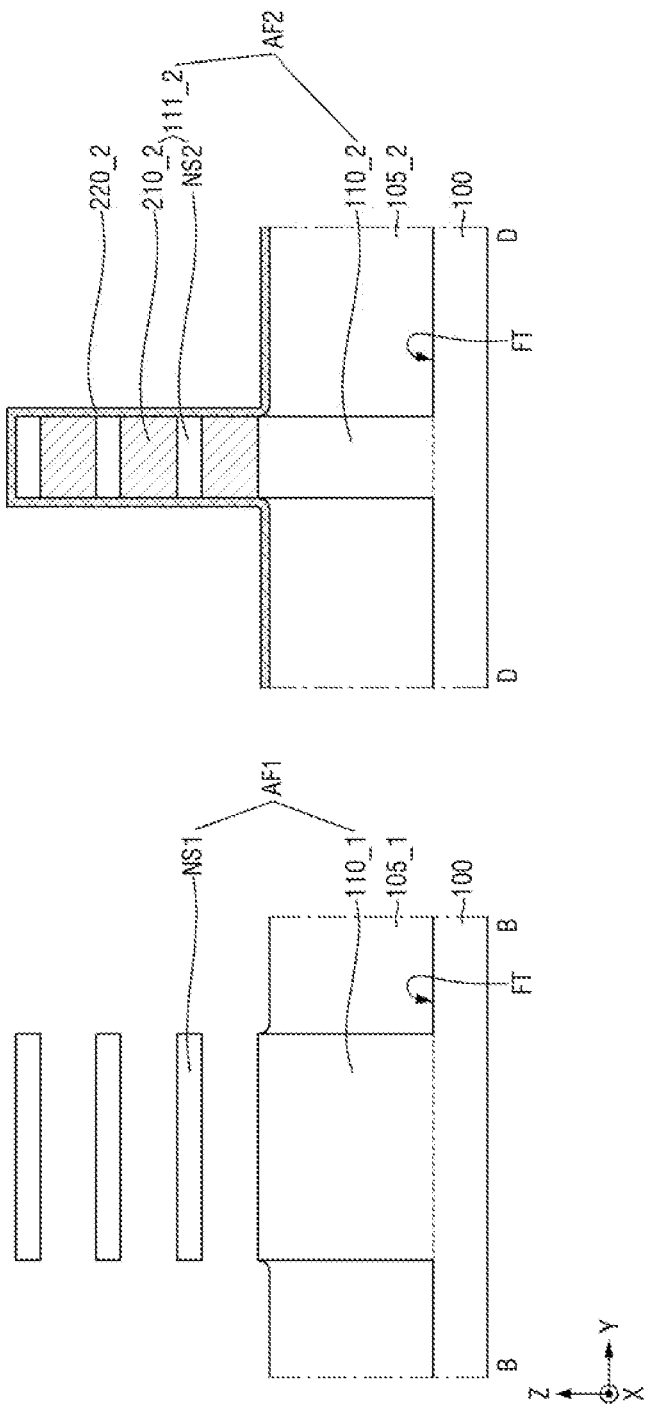

Referring to FIGS. 15 to 17, the fourth etching process and the third etching process of removing the second passivation film 230_2 and the third passivation film may be performed after removal of the first sacrificial layer 210_1. In an implementation, while the second etching process of removing the first sacrificial layer 210_1 is performed, the second passivation film 230_2 may protect the first field insulating film 105_1, and the third passivation film 230_3 may protect the second insulating liner 220_2 and the second upper pattern 111_2.

By way of summation and review, a multi gate transistor may use a three-dimensional channel, and scaling may be easily performed. Further, even if a gate length of the multi gate transistor is not increased, the current control capability may be improved. Furthermore, a SCE (short channel effect) in which potential of a channel region is influenced by a drain voltage may be effectively suppressed.

One or more embodiments may provide a method for manufacturing a semiconductor device including a MBCFET™ (Multi-Bridge Channel Field Effect Transistor).

One or more embodiments may provide a method for manufacturing a semiconductor device capable of improving element performance and reliability by maximizing etching selectivity of a silicon-germanium (SiGe) film to a silicon film.

One or more embodiments may provide an oxide film coating solution capable of improving element performance and reliability by maximizing etching selectivity of a silicon-germanium film to a silicon film.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for manufacturing a semiconductor device, the method comprising:
    forming a fin type pattern including a lower pattern and an upper pattern on a substrate, the upper pattern including a plurality of sacrificial layers and a plurality of sheet patterns alternately stacked on the lower pattern;
    forming a field insulating film on the substrate and the fin type pattern such that the field insulation film covers side walls of the lower pattern;
    forming a passivation film on the field insulating film such that the passivation film extends along an upper surface of the field insulating film, wherein forming the passivation film includes applying a coating solution on the field insulating film to form a coating layer, and heat-treating the coating layer to adsorb the coating layer to the upper surface of the field insulating film; and
    removing the plurality of sacrificial layers after forming the passivation film.

2. The method for manufacturing the semiconductor device as claimed in claim 1, wherein the coating solution includes:
    a silane compound, and
    an organic solvent in which the silane compound is dissolved.

3. The method for manufacturing the semiconductor device as claimed in claim 2, wherein the silane compound is represented by Chemical Formula 1 or Chemical Formula 2 below:

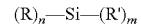  (Chemical Formula 1)

in Chemical Formula 1,
    R is an alkyl having a carbon number of 1 to 20, amine, fluorine, chlorine, vinyl, sulfur, methacryl, acetoxy, isocyanurate, or alkyleneoxy group,
    R' is an alkyl, methoxy, ethoxy, chloro, or disilazane group,
    n and m are integers of 1 to 3, and
    n+m is 4,

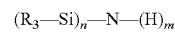  (Chemical Formula 2)

in Chemical Formula 2,
    R is an alkyl having a carbon number of 1 to 20, amine, fluorine, chlorine, vinyl, sulfur, methacryl, acetoxy, isocyanurate, or alkyleneoxy group,
    n and m are integers of 0 to 3, and
    n+m is 3.

4. The method for manufacturing the semiconductor device as claimed in claim 2, wherein the silane compound is included in the coating solution in an amount of 5 wt % to 8 wt %, based on 100 wt % of the coating solution.

5. The method for manufacturing the semiconductor device as claimed in claim 2, wherein the organic solvent includes a ketone, a hydrocarbon, or an ether.

6. The method for manufacturing the semiconductor device as claimed in claim 1, further comprising:
    removing the passivation film after removing the plurality of sacrificial layers; and
    forming a gate electrode that intersects the lower pattern after removing the passivation film.

7. A method for manufacturing a semiconductor device, the method comprising:
    forming a first fin type pattern including a first lower pattern and a first upper pattern on a first region of a substrate such that the first upper pattern includes a plurality of first sacrificial layers and a plurality of first sheet patterns alternately stacked on the first lower pattern;
    forming a second fin type pattern including a second lower pattern and a second upper pattern on a second region of the substrate such that the second upper pattern includes a plurality of second sacrificial layers and a plurality of second sheet patterns alternately stacked on the second lower pattern;
    forming a first field insulating film on the first region of the substrate such that the first field insulating film covers side walls of the first lower pattern;
    forming a second field insulating film on the second region of the substrate such that the second field insulating film covers side walls of the second lower pattern;
    forming an insulating liner on the second field insulating film, along profiles of an upper surface of the second field insulating film, and on the second upper pattern;
    forming a first passivation film on the first field insulating film, wherein forming the first passivation film includes applying a coating solution on the first field insulating film to form a first coating layer, and heat-treating the first coating layer to adsorb the first coating layer to an upper surface of the first field insulating film;

forming a second passivation film on the insulating liner; and removing the plurality of first sacrificial layers, after forming the first passivation film and the second passivation film.

8. The method for manufacturing the semiconductor device as claimed in claim 7, wherein:

forming the second passivation film includes
applying the coating solution onto the insulating liner of the second region to form a second coating layer, and
heat-treating the second coating layer to adsorb the second coating layer to the insulating liner.

9. The method for manufacturing the semiconductor device as claimed in claim 7, wherein the coating solution includes:

a silane compound, and
an organic solvent in which the silane compound is dissolved.

10. The method for manufacturing the semiconductor device as claimed in claim 9, wherein the silane compound is represented by Chemical Formula 1 or Chemical Formula 2 below:

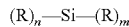  (Chemical Formula 1)

in Chemical Formula 1,

R is an alkyl having a carbon number of 1 to 20, amine, fluorine, chlorine, vinyl, sulfur, methacryl, acetoxy, isocyanurate, or alkyleneoxy group, R' is an alkyl, methoxy, ethoxy, chloro, or disilazane group, n and m are integers of 1 to 3, and n+m is 4,

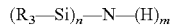  (Chemical Formula 2)

in Chemical Formula 2,

R is an alkyl having a carbon number of 1 to 20, amine, fluorine, chlorine, vinyl, sulfur, methacryl, acetoxy, isocyanurate, or alkyleneoxy group, n and m are integers of 0 to 3, and n+m is 3.

11. The method for manufacturing the semiconductor device as claimed in claim 9, wherein the silane compound is included in the coating solution in an amount of 5 wt % to 8 wt %, based on 100 wt % of the coating solution.

12. The method for manufacturing the semiconductor device as claimed in claim 9, wherein the organic solvent includes a ketone, a hydrocarbon, or an ether.

13. The method for manufacturing the semiconductor device as claimed in claim 7, wherein removing the plurality of first sacrificial layers includes:

forming a mask layer on the substrate of the second region, and
processing an etching solution on the substrate of the first region exposed by the mask layer.

14. The method for manufacturing the semiconductor device as claimed in claim 13, wherein the etching solution includes hydrogen fluoride (HF) and percetic acid.

15. The method for manufacturing the semiconductor device as claimed in claim 7, wherein the first field insulating film and the second field insulating film each include $SiO_2$.

16. The method for manufacturing the semiconductor device as claimed in claim 7, wherein the first passivation film is in contact with an upper surface of the first field insulating film and is not in contact with side surfaces of the plurality of first sacrificial layers.

17. The method of claim 1, wherein the passivation film is not formed on an uppermost surface of the upper pattern.

18. The method of claim 7, wherein the first passivation film is not formed on an uppermost surface of the first upper pattern.

* * * * *